(12) United States Patent
Matsuo

(10) Patent No.: US 9,536,624 B2
(45) Date of Patent: Jan. 3, 2017

(54) DATA TRANSFER CIRCUIT

(71) Applicant: FUJITSU LIMITED, Kawasaki-shi, Kanagawa (JP)

(72) Inventor: Tatsuru Matsuo, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/606,606

(22) Filed: Jan. 27, 2015

(65) Prior Publication Data
US 2015/0279482 A1 Oct. 1, 2015

(30) Foreign Application Priority Data
Mar. 27, 2014 (JP) .................................. 2014-067135

(51) Int. Cl.
G11C 19/00 (2006.01)
G11C 19/28 (2006.01)

(52) U.S. Cl.
CPC .................................. G11C 19/287 (2013.01)

(58) Field of Classification Search
None
See application file for complete search history.

(56) References Cited

U.S. PATENT DOCUMENTS

| 8,002,370 B2* | 8/2011 | Shoji | .................... B41J 2/04541 347/12 |
| 8,018,445 B2* | 9/2011 | Tokunaga | ................ G11C 7/02 377/64 |
| 2004/0202276 A1* | 10/2004 | Osame | .................... G11C 19/00 377/64 |
| 2010/0034339 A1* | 2/2010 | Iwai | ....................... G11C 19/28 377/77 |

FOREIGN PATENT DOCUMENTS

| JP | 05-250316 | 9/1993 |
| JP | 2005-266856 | 9/2005 |
| JP | 2013-122800 | 6/2013 |

* cited by examiner

Primary Examiner — Long Nguyen
(74) Attorney, Agent, or Firm — Fujitsu Patent Center

(57) ABSTRACT

A data transfer circuit has a first data transmission unit and two or more second shift registers. The first data transmission unit has a first shift register which has a plurality of first flip flop circuits which store data, shifts the data of the plurality of first flip flop circuits, and transmits data of two or more output terminals out of output terminals of the plurality of first flip flop circuits to the two or more second shift registers. The two or more second shift registers each shift data inputted from the two or more output terminals out of the output terminals of the plurality of first flip flop circuits.

9 Claims, 9 Drawing Sheets

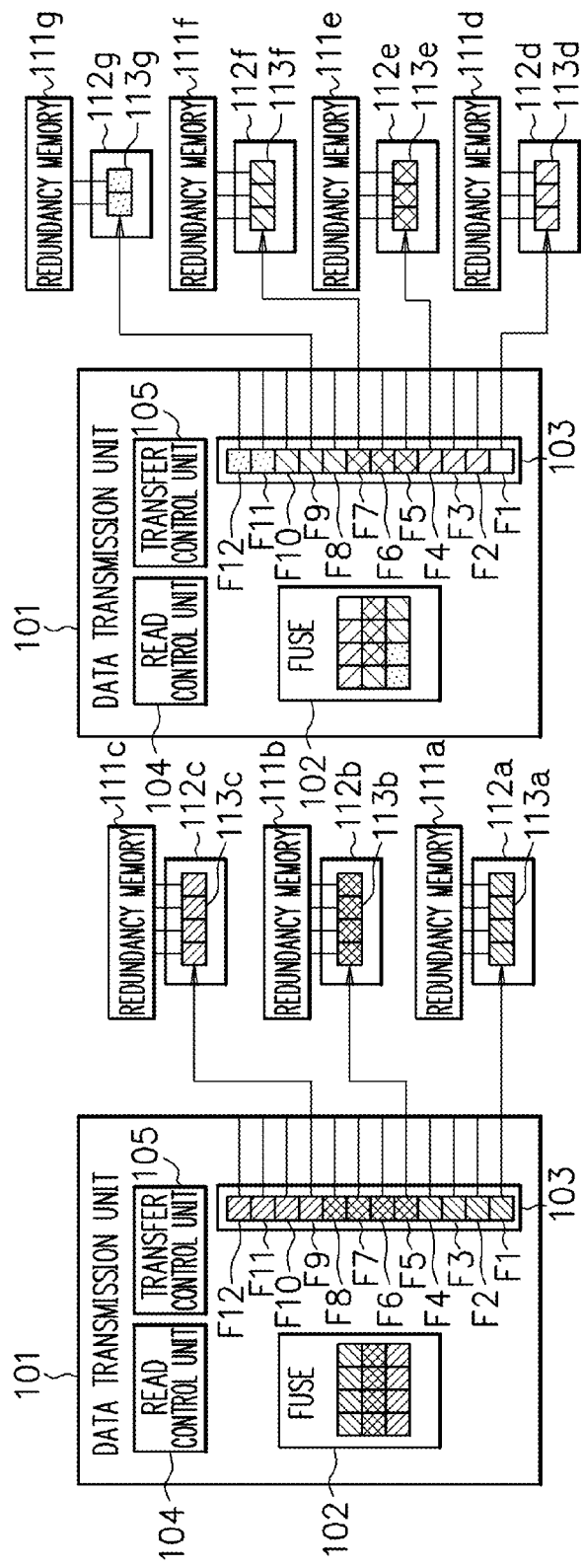

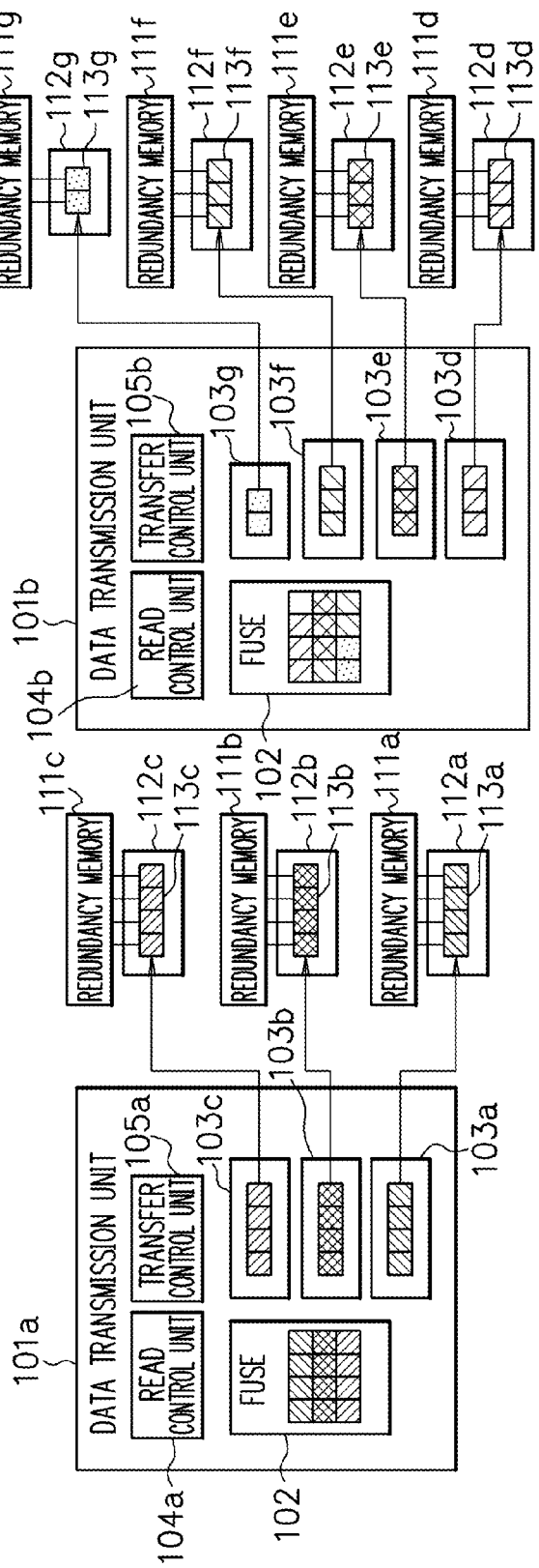

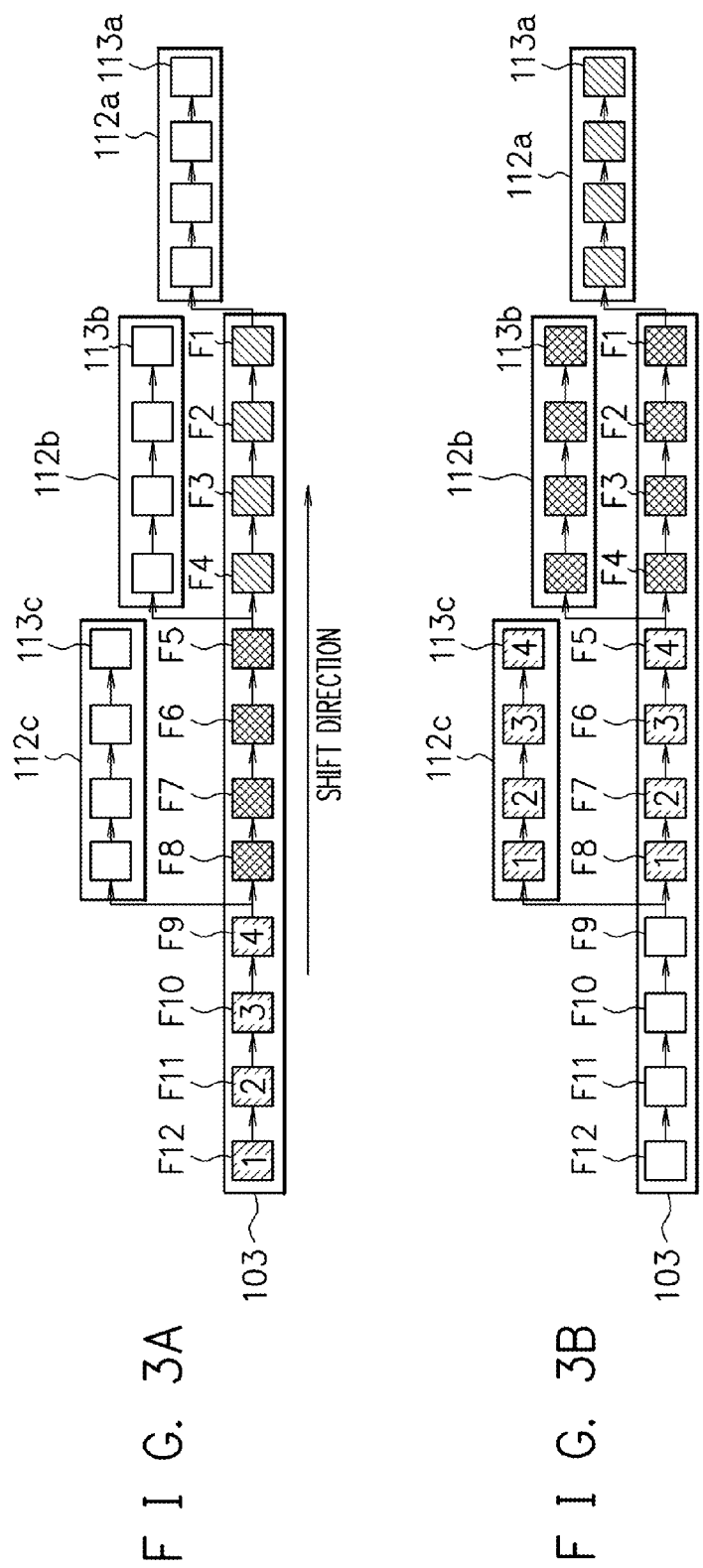

DATA TRANSFER CIRCUIT

CROSS-REFERENCE TO RELATED APPLICATION

This application is based upon and claims the benefit of priority of the prior Japanese Patent Application No. 2014-067135, filed on Mar. 27, 2014, the entire contents of which are incorporated herein by reference.

FIELD

The embodiments discussed herein relate to a data transfer circuit.

BACKGROUND

There is known an inter-device interface method between a first device operating at timings of a first clock and a second device operating at timings of a second clock which is a cycle of 1/n times the first clock (see, for example, Patent Document 1). A first switching means in the first device converts parallel data with a predetermined bit length which are transmitted from the first device to the second device into serial data by every m-bit unit where m≤n. A serial data interface line for every m-bit unit transmits the serial data converted by the first switching means to the second device. A second switching means in the second device receives at a timing of the second clock the serial data transmitted by the serial data interface line and converts the data into parallel data with a predetermined bit length. A data conversion control means in the second device executes a data switching instruction for the first switching means and a data switching instruction for the second switching means at a timing of the second clock. A data switching instruction line transmits the data switching instruction for the first switching means by the data conversion control means to the first device. In one cycle of the first clock, parallel data with a predetermined bit length are divided into serial data in m-bit units, and are transmitted from the first device to the second device at a timing of the second clock.

Further, there is known a memory device which has a plurality of redundancy memories each having pluralities of ordinary memory cell blocks and spare memory cell blocks and a plurality of flip flops each connected in series, each storing a numeric value, and respectively outputting numeric values to the plurality of redundancy memories (see, for example, Patent Document 2). A non-volatile memory stores a seed value. A pseudo-random number generating circuit generates reproducible pseudo-random numbers based on the seed value stored in the non-volatile memory, and serially outputs pseudo-random numbers to the plurality of flip flops. The plurality of flip flops serially transfer, in synchronization with a clock signal, the pseudo-random numbers outputted by the pseudo-random number generating circuit. Each of the plurality of redundancy memories switch one of the plurality of ordinary memory cell blocks to a spare memory cell block according to numeric values stored in the plurality of flip flops.

Further, there is known a serial interface circuit which has a shift register generating an address signal and a second data signal based on a first data signal and a clock signal, and a register generating unit writing the second data signal in a register specified by an address decoder (see, for example, Patent Document 3). An address control circuit outputs a first address value specifying a register to the address decoder based on the address signal. A control circuit outputs to the address control circuit a control signal allowing outputting the first address value and writing the second data signal in the register or not allowing outputting the first address value based on the clock signal and a standby signal.

[Patent Document 1] Japanese Laid-open Patent Publication No. 5-250316

[Patent Document 2] Japanese Laid-open Patent Publication No. 2013-122800

[Patent Document 3] Japanese Laid-open Patent Publication No. 2005-266856

In every type of semiconductor chip, the number of shift registers and/or the shift register length is different. Therefore, the data transmission unit transmitting data to the shift registers have a different configuration in every type of semiconductor chip and is difficult to be commonized.

SUMMARY

A data transfer circuit has a first data transmission unit and two or more second shift registers. The first data transmission unit has a first shift register which has a plurality of first flip flop circuits which store data, shifts the data of the plurality of first flip flop circuits, and transmits data of two or more output terminals out of output terminals of the plurality of first flip flop circuits to the two or more second shift registers. The two or more second shift registers each shift data inputted from the two or more output terminals out of the output terminals of the plurality of first flip flop circuits.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B are diagrams illustrating a structural example of a semiconductor chip of a data transfer circuit according to a first embodiment;

FIGS. 2A and 2B are diagrams illustrating a structural example of a semiconductor chip of another data transfer circuit;

FIGS. 3A and 3B are diagrams for explaining a shift operation of the data transfer circuit of FIG. 1A;

DESCRIPTION OF EMBODIMENTS

First Embodiment

Figures 4A, 4B:
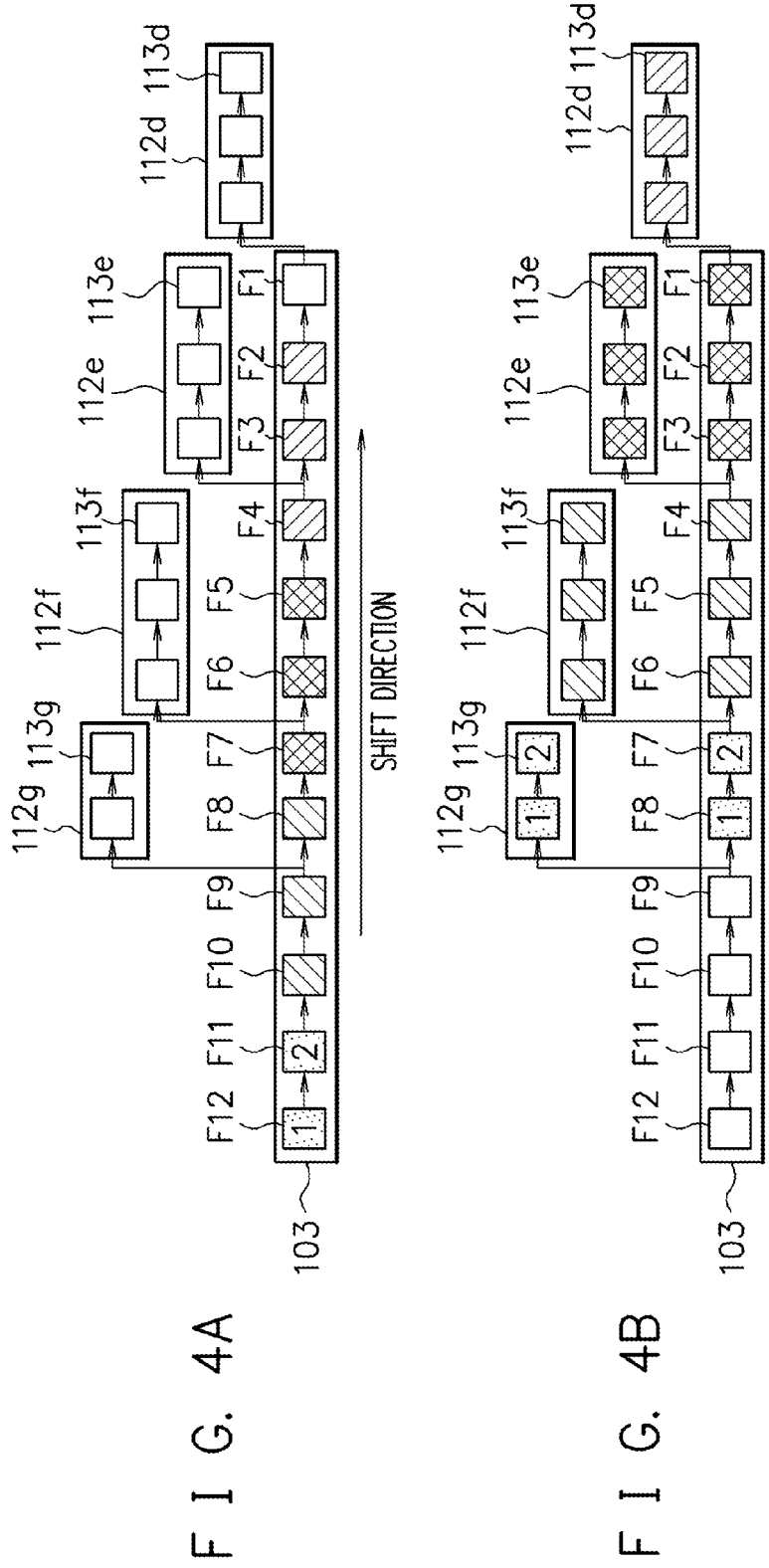
FIGS. 4A and 4B are diagrams for explaining a shift operation of the data transfer circuit of FIG. 1B.

FIG. 1A is a diagram illustrating a structural example of a semiconductor chip of a data transfer circuit according to a first embodiment. The data transfer circuit has a first data transmission unit 101, a plurality of redundancy memories 111a to 111c, and a plurality of reception shift registers (second shift registers) 112a to 112c. The data transmission unit 101 has a non-volatile memory 102, a transmission shift register (first shift register) 103, a read control unit 104, and a transfer control unit 105.

The redundancy memories 111a to 111c each have a plurality of ordinary memory cells and a plurality of spare memory cells. By inspection, the ordinary memory cells are separated into normal ordinary memory cells and defective ordinary memory cells, and addresses of the defective ordinary memory cells are written in the non-volatile memory 102. The non-volatile memory 102 is a fuse memory for example, and stores information (data) of the addresses of the defective ordinary memory cells of the redundancy memories 111a to 111c.

The fuse memory 102 is a non-volatile memory which can retain data after power is turned off. The fuse memory 102 has fuses for storing data and stores, for example, "0" if a fuse is in an uncut state or "1" if a fuse is in a cut state. By cutting the fuses, data can be written only once. The cutting of the fuses is done after the semiconductor chip is manufactured.

The reception shift register 112a has, for example, four flip flop circuits 113a, and can shift data of the four flip flop circuits 113a in a direction from left to right. To the redundancy memory 111a, 4-bit data can be inputted from the four flip flop circuits 113a in the reception shift register 112a.

The reception shift register 112b has, for example, four flip flop circuits 113b, and can shift data of the four flip flop circuits 113b in the direction from left to right. To the redundancy memory 111b, 4-bit data can be inputted from the four flip flop circuits 113b in the reception shift register 112b.

The reception shift register 112c has, for example, four flip flop circuits 113c, and can shift data of the four flip flop circuits 113c in the direction from left to right. To the redundancy memory 111c, 4-bit data can be inputted from the four flip flop circuits 113c in the reception shift register 112c.

The transmission shift register 103 has a plurality of first flip flop circuits F1 to F12 which store data, and can shift data of the plurality of first flip flop circuits F1 to F12 in a direction from the flip flop circuit F12 to F1. The flip flop circuit F1 is a flip flop circuit at the head of the transmission shift register 103, and the flip flop circuit F12 is a flip flop circuit at the end of the transmission shift register 103. Output terminals of the twelve flip flop circuits F1 to F12 are connectable to an outside of the data transmission unit 101. The transmission shift register 103 and the reception shift registers 112a to 112c are volatile memories.

An input terminal of the reception shift register 112a is connected to the output terminal of the flip flop circuit F1 in the transmission shift register 103. An input terminal of the reception shift register 112b is connected to the output terminal of the flip flop circuit F5 in the transmission shift register 103. An input terminal of the reception shift register 112c is connected to the output terminal of the flip flop circuit F9 in the transmission shift register 103.

The non-volatile memory 102 stores information (data) of addresses of defective ordinary memory cells of the redundancy memories 111a to 111c. The read control unit 104 reads data of the non-volatile memory 102 into the flip flop circuits F1 to F12 in the transmission shift register 103. In the flip flop circuits F1 to F4, address information of defective ordinary memory cells of the redundancy memory 111a is stored. In the flip flop circuits F5 to F8, address information of defective ordinary memory cells of the redundancy memory 111b is stored. In the flip flop circuits F9 to F12, address information of defective ordinary memory cells of the redundancy memory 111c is stored.

The transfer control unit 105 instructs the transmission shift register 103 and the reception shift registers 112a to 112c to perform a data shift with a data shift amount of "4". The shift amount "4" is the same as the respective quantities of four flip flop circuits 113a to 113c in the reception shift registers 112a to 112c. FIG. 3A is a diagram illustrating data stored in the transmission shift register 103 and the reception shift registers 112a to 112c before the data shift, and FIG. 3B is a diagram illustrating data stored in the transmission shift register 103 and the reception shift registers 112a to 112c after the data shift.

The transmission shift register 103 shifts data of the flip flop circuits F12 to F1 in the direction from the flip flop circuit F12 to F1 by "4". In the flip flop circuits F1 to F12 after the shift in FIG. 3B, data shifted by "4" in the shift direction relative to the data of the flip flop circuits F1 to F12 before the shift in FIG. 3A are stored.

To the reception shift register 112a, data outputted from the output terminal of the flip flop circuit F1 in the transmission shift register 103 are inputted, and data of the four flip flop circuits 113a are shifted by "4" in the direction from left to right. As a result, in the four flip flop circuits 113a in the reception shift register 112a after the shift in FIG. 3B, the data stored in the flip flop circuits F1 to F4 in the transmission shift register 103 before the shift in FIG. 3A, that is, the address information of defective ordinary memory cells of the redundancy memory 111a is stored.

To the reception shift register 112b, data outputted from the output terminal of the flip flop circuit F5 in the transmission shift register 103 are inputted, and data of the four flip flop circuits 113b are shifted by "4" in the direction from left to right. As a result, in the four flip flop circuits 113b in the reception shift register 112b after the shift in FIG. 3B, the data stored in the flip flop circuits F5 to F8 in the transmission shift register 103 before the shift in FIG. 3A, that is, the address information of defective ordinary memory cells of the redundancy memory 111b is stored.

To the reception shift register 112c, data outputted from the output terminal of the flip flop circuit F9 in the transmission shift register 103 are inputted, and data of the four flip flop circuits 113c are shifted by "4" in the direction from left to right. As a result, in the four flip flop circuits 113c in the reception shift register 112c after the shift in FIG. 3B, the data stored in the flip flop circuits F9 to F12 in the transmission shift register 103 before the shift in FIG. 3A, that is, the address information of defective ordinary memory cells of the redundancy memory 111c is stored.

To the redundancy memory 111a, four-bit address information stored in the four flip flop circuits 113a in the reception shift register 112a are inputted, and based on this address information, the defective ordinary memory cells are replaced with normal spare memory cells and data access is performed. Thus, repair of the defective ordinary memory cells is performed.

Similarly, to the redundancy memory 111b, four-bit address information stored in the four flip flop circuits 113b in the reception shift register 112b are inputted, and based on this address information, the defective ordinary memory cells are replaced with normal spare memory cells and data access is performed. Thus, repair of the defective ordinary memory cells is performed.

Similarly, to the redundancy memory 111c, four-bit address information stored in the four flip flop circuits 113c in the reception shift register 112c are inputted, and based on this address information, the defective ordinary memory cells are replaced with normal spare memory cells and data access is performed. Thus, repair of the defective ordinary memory cells is performed.

FIG. 1B is a diagram illustrating a structural example of a semiconductor chip of another data transfer circuit according to a first embodiment. The semiconductor chip of FIG. 1B has the same data transmission unit 101 as the semiconductor chip of FIG. 1A. However, redundancy memories 111d to 111g and reception shift registers 112d to 112g of FIG. 1B are different from the redundancy memories 111a to 111c and the reception shift registers 112a to 112c of FIG. 1A. Specifically, the four redundancy memories 111d to 111g of FIG. 1B differ in quantity from the three redundancy memories 111a to 111c of FIG. 1A. Further, 3-bit data and 2-bit data inputted to the four redundancy memories 111d to 111g of FIG. 1B from the reception shift registers 112d to 112g differ in bit length from 4-bit data inputted to the three redundancy memories 111a to 111c of FIG. 1A from the reception shift registers 112a to 112c. As a result, three flip flop circuits 113d to 113f and two flip flop circuits 113g in the reception shift registers 112d to 112g of FIG. 1B differ in quantity from the four flip flop circuits 113a to 113c in the reception shift registers 112a to 112c of FIG. 1A. As described above, depending on the type of the semiconductor chip, the quantity of reception shift registers 112d to 112g and the respective quantities of flip flop circuits 113d to 113g change.

The reception shift register 112d has three flip flop circuits 113d for example, and can shift data of the three flip flop circuits 113d in the direction from left to right. To the redundancy memory 111d, 3-bit data can be inputted from the three flip flop circuits 113d in the reception shift register 112d.

The reception shift register 112e has three flip flop circuits 113e for example, and can shift data of the three flip flop circuits 113e in the direction from left to right. To the redundancy memory 111e, 3-bit data can be inputted from the three flip flop circuits 113e in the reception shift register 112e.

The reception shift register 112f has three flip flop circuits 113f for example, and can shift data of the three flip flop circuits 113f in the direction from left to right. To the redundancy memory 111f, 3-bit data can be inputted from the three flip flop circuits 113f in the reception shift register 112f.

The reception shift register 112g has two flip flop circuits 113g for example, and can shift data of the two flip flop circuits 113g in the direction from left to right. To the redundancy memory 111g, 2-bit data can be inputted from the two flip flop circuits 113g in the reception shift register 112g.

An input terminal of the reception shift register 112d is connected to the output terminal of the flip flop circuit F1 in the transmission shift register 103. An input terminal of the reception shift register 112e is connected to the output terminal of the flip flop circuit F4 in the transmission shift register 103. An input terminal of the reception shift register 112f is connected to the output terminal of the flip flop circuit F7 in the transmission shift register 103. An input terminal of the reception shift register 112g is connected to the output terminal of the flip flop circuit F9 in the transmission shift register 103.

The non-volatile memory 102 stores information of addresses of defective ordinary memory cells of the redundancy memories 111d to 111g. The read control unit 104 reads data of the non-volatile memory 102 into flip flop circuits F1 to F12 in the transmission shift register 103. In the flip flop circuits F2 to F4, address information of defective ordinary memory cells of the redundancy memory 111d is stored. In the flip flop circuits F5 to F7, address information of defective ordinary memory cells of the redundancy memory 111e is stored. In the flip flop circuits F8 to F10, address information of defective ordinary memory cells of the redundancy memory 111f is stored. In the flip flop circuits F11 and F12, address information of defective ordinary memory cells of the redundancy memory 111g is stored.

The transfer control unit 105 instructs the transmission shift register 103 and the reception shift registers 112d to 112g to perform a data shift with a data shift amount of "4". The shift amount "4" is larger than the respective quantities of three flip flop circuits 113d to 113f and two flip flop circuits 113g in the reception shift registers 112d to 112g. FIG. 4A is a diagram illustrating data stored in the transmission shift register 103 and the reception shift registers 112d to 112g before the data shift, and FIG. 4B is a diagram illustrating data stored in the transmission shift register 103 and the reception shift registers 112d to 112g after the data shift.

The transmission shift register 103 shifts data of the flip flop circuits F1 to F12 by "4" in the direction from the flip flop circuit F12 to F1. In the flip flop circuits F1 to F12 after the shift in FIG. 4B, data shifted by "4" in the shift direction relative to the data of the flip flop circuits F1 to F12 before the shift in FIG. 4A are stored.

To the reception shift register 112d, data outputted from the output terminal of the flip flop circuit F1 in the transmission shift register 103 are inputted, and data of the three flip flop circuits 113d are shifted by "4" in the direction from left to right. As a result, in the three flip flop circuits 113d in the reception shift register 112d after the shift in FIG. 4B, the data stored in the flip flop circuits F2 to F4 in the transmission shift register 103 before the shift in FIG. 4A, that is, the address information of defective ordinary memory cells of the redundancy memory 111d is stored.

To the reception shift register 112e, data outputted from the output terminal of the flip flop circuit F4 in the transmission shift register 103 are inputted, and data of the three flip flop circuits 113e are shifted by "4" in the direction from left to right. As a result, in the three flip flop circuits 113e in the reception shift register 112e after the shift in FIG. 4B, the data stored in the flip flop circuits F5 to F7 in the transmission shift register 103 before the shift in FIG. 4A, that is, the address information of defective ordinary memory cells of the redundancy memory 111e is stored.

To the reception shift register 112f, data outputted from the output terminal of the flip flop circuit F7 in the transmission shift register 103 are inputted, and data of the three flip flop circuits 113f are shifted by "4" in the direction from left to right. As a result, in the three flip flop circuits 113f in the reception shift register 112f after the shift in FIG. 4B, the data stored in the flip flop circuits F8 to F10 in the transmission shift register 103 before the shift in FIG. 4A, that is, the address information of defective ordinary memory cells of the redundancy memory 111*f* is stored.

To the reception shift register 112*g*, data outputted from the output terminal of the flip flop circuit F9 in the transmission shift register 103 are inputted, and data of the two flip flop circuits 113*g* are shifted by "4" in the direction from left to right. As a result, in the two flip flop circuits 113*g* in the reception shift register 112*g* after the shift in FIG. 4B, the data stored in the flip flop circuits F11 and F12 in the transmission shift register 103 before the shift in FIG. 4A, that is, the address information of defective ordinary memory cells of the redundancy memory 111*g* is stored.

To the redundancy memory 111*d*, three-bit address information stored in the three flip flop circuits 113*d* in the reception shift register 112*d* are inputted, and based on this address information, the defective ordinary memory cells are replaced with normal spare memory cells and data access is performed. Thus, repair of the defective ordinary memory cells is performed.

Similarly, to the redundancy memory 111*e*, three-bit address information stored in the three flip flop circuits 113*e* in the reception shift register 112*e* are inputted, and based on this address information, the defective ordinary memory cells are replaced with normal spare memory cells and data access is performed. Thus, repair of the defective ordinary memory cells is performed.

Similarly, to the redundancy memory 111*f*, three-bit address information stored in the three flip flop circuits 113*f* in the reception shift register 112*f* are inputted, and based on this address information, the defective ordinary memory cells are replaced with normal spare memory cells and data access is performed. Thus, repair of the defective ordinary memory cells is performed.

Similarly, to the redundancy memory 111*g*, two-bit address information stored in the two flip flop circuits 113*g* in the reception shift register 112*g* are inputted, and based on this address information, the defective ordinary memory cells are replaced with normal spare memory cells and data access is performed. Thus, repair of the defective ordinary memory cells is performed.

As above, in FIG. 1A, the input terminals of the reception shift registers 112*a* to 112*c* are connected to the output terminals of the flip flop circuits F1, F5, and F9, respectively, according to the number of reception shift registers 112*a* to 112*c* and the number of flip flop circuits 113*a* to 113*c* inside each of the reception shift registers 112*a* to 112*c*.

On the other hand, in FIG. 1B, the input terminals of the reception shift registers 112*d* to 112*g* are connected to the output terminals of the flip flop circuits F1, F4, F7, and F9, respectively, according to the number of reception shift registers 112*d* to 112*g* and the number of flip flop circuits 113*d* to 113*g* inside each of the reception shift registers 112*d* to 112*g*.

In this embodiment, according to the number of reception shift registers and/or the number of flip flop circuits inside each of the reception shift registers, data are transmitted to the reception shift registers from different output terminals of the flip flop circuits in the transmission shift register 103. Thus, the same data transmission unit 101 can be commonized for plural types of semiconductor chips such as the semiconductor chip of FIG. 1A and the semiconductor chip of FIG. 1B, or the like.

Note that although the example of the three reception shift registers 112*a* to 112*c* is illustrated in FIG. 1A and the example of the four reception shift registers 112*d* to 112*g* is illustrated in FIG. 1B, the reception shift registers may be two or more. The transmission shift register 103 shifts data of the flip flop circuits F1 to F12, and transmits data of two or more output terminals among the output terminals of the flip flop circuits F1 to F12 to two or more reception shift registers, respectively. The two or more reception shift registers shift data inputted respectively from the two or more output terminals among the output terminals of the flip flop circuits F1 to F12.

Next, with reference to FIGS. 2A and 2B, reasons why it is difficult to commonize the data transmission unit 101 in ordinary technologies will be described.

FIG. 2A corresponds to FIG. 1A and is a diagram illustrating a structural example of a semiconductor chip of another data transfer circuit. The semiconductor chip of FIG. 2A is the same as the semiconductor chip of FIG. 1A in redundancy memories 111*a* to 111*c* and reception shift registers 112*a* to 112*c*. However, a data transmission unit 101*a* of FIG. 2A is different from the data transmission unit 101 of FIG. 1A. The data transmission unit 101*a* of FIG. 2A has a non-volatile memory 102, transmission shift registers 103*a* to 103*c*, a read control unit 104*a*, and a transfer control unit 105*a*.

The transmission shift register 103*a* has four flip flop circuits similarly to the reception shift register 112*a* and is connected to the reception shift register 112*a*. The transmission shift register 103*b* has four flip flop circuits similarly to the reception shift register 112*b* and is connected to the reception shift register 112*b*. The transmission shift register 103*c* has four flip flop circuits similarly to the reception shift register 112*c* and is connected to the reception shift register 112*c*.

The read control unit 104*a* reads data of the non-volatile memory 102 into the transmission shift registers 103*a* to 103*c*. In the transmission shift register 103*a*, address information of defective ordinary memory cells of the redundancy memory 111*a* is stored. In the transmission shift register 103*b*, address information of defective ordinary memory cells of the redundancy memory 111*b* is stored. In the transmission shift register 103*c*, address information of defective ordinary memory cells of the redundancy memory 111*c* is stored.

The transmission shift register 103*a* and the reception shift register 112*a* perform a data shift with a data shift amount of "4" by control of the transfer control unit 105*a*. As a result, in the four flip flop circuits 113*a* in the reception shift register 112*a*, the data stored in the four flip flop circuits in the transmission shift register 103*a*, that is, the address information of defective ordinary memory cells of the redundancy memory 111*a* is stored.

The transmission shift register 103*b* and the reception shift register 112*b* perform a data shift with a data shift amount of "4" by control of the transfer control unit 105*a*. As a result, in the four flip flop circuits 113*b* in the reception shift register 112*b*, the data stored in the four flip flop circuits in the transmission shift register 103*b*, that is, the address information of defective ordinary memory cells of the redundancy memory 111*b* is stored.

The transmission shift register 103*c* and the reception shift register 112*c* perform a data shift with a data shift amount of "4" by control of the transfer control unit 105*a*. As a result, in the four flip flop circuits 113*c* in the reception shift register 112*c*, the data stored in the four flip flop circuits in the transmission shift register 103*c*, that is, the address information of defective ordinary memory cells of the redundancy memory 111*c* is stored.

FIG. 2B corresponds to FIG. 1B and is a diagram illustrating a structural example of a semiconductor chip of another data transfer circuit. The semiconductor chip of FIG.

2B is the same as the semiconductor chip of FIG. 1B in redundancy memories 111d to 111g and reception shift registers 112d to 112g. However, a data transmission unit 101b of FIG. 2B is different from the data transmission unit 101 of FIG. 1B. The data transmission unit 101b of FIG. 2B has a non-volatile memory 102, transmission shift registers 103d to 103g, a read control unit 104b, and a transfer control unit 105b.

The transmission shift register 103d has three flip flop circuits similarly to the reception shift register 112d and is connected to the reception shift register 112d. The transmission shift register 103e has three flip flop circuits similarly to the reception shift register 112e and is connected to the reception shift register 112e. The transmission shift register 103f has three flip flop circuits similarly to the reception shift register 112f and is connected to the reception shift register 112f. The transmission shift register 103g has two flip flop circuits similarly to the reception shift register 112g and is connected to the reception shift register 112g.

The read control unit 104b reads data of the non-volatile memory 102 into the transmission shift registers 103d to 103g. In the transmission shift register 103d, address information of defective ordinary memory cells of the redundancy memory 111d is stored. In the transmission shift register 103e, address information of defective ordinary memory cells of the redundancy memory 111e is stored. In the transmission shift register 103f, address information of defective ordinary memory cells of the redundancy memory 111f is stored. In the transmission shift register 103g, address information of defective ordinary memory cells of the redundancy memory 111g is stored.

The transmission shift register 103d and the reception shift register 112d perform a data shift with a data shift amount of "3" by control of the transfer control unit 105b. As a result, in the three flip flop circuits 113d in the reception shift register 112d, the data stored in the three flip flop circuits in the transmission shift register 103d, that is, the address information of defective ordinary memory cells of the redundancy memory 111d is stored.

The transmission shift register 103e and the reception shift register 112e perform a data shift with a data shift amount of "3" by control of the transfer control unit 105b. As a result, in the three flip flop circuits 113e in the reception shift register 112e, the data stored in the three flip flop circuits in the transmission shift register 103e, that is, the address information of defective ordinary memory cells of the redundancy memory 111e is stored.

The transmission shift register 103f and the reception shift register 112f perform a data shift with a data shift amount of "3" by control of the transfer control unit 105b. As a result, in the three flip flop circuits 113f in the reception shift register 112f, the data stored in the three flip flop circuits in the transmission shift register 103f, that is, the address information of defective ordinary memory cells of the redundancy memory 111f is stored.

The transmission shift register 103g and the reception shift register 112g perform a data shift with a data shift amount of "2" by control of the transfer control unit 105b. As a result, in the two flip flop circuits 113g in the reception shift register 112g, the data stored in the two flip flop circuits in the transmission shift register 103g, that is, the address information of defective ordinary memory cells of the redundancy memory 111g is stored.

As described above, in FIG. 2A, the data transmission unit 101a has the three transmission shift registers 103a to 103c each having four flip flop circuits. On the other hand, in FIG. 2B, the data transmission unit 101b has the transmission shift registers 103d to 103f each having three flip flop circuits and the transmission shift register 103g having two flip flop circuits. In FIGS. 2A and 2B, since the number of transmission shift registers and the number of flip flop circuits in the transmission shift registers are different, the read control unit 104b and the transfer control unit 105b of FIG. 2B are different from the read control unit 104a and the transfer control unit 105a, respectively, of FIG. 2A. Therefore, between the semiconductor chip of FIG. 2A and the semiconductor chip of FIG. 2B, only the non-volatile memory 102 can be commonized, and the other circuits in the data transmission units cannot be commonized.

On the other hand, as illustrated in FIGS. 1A and 1B, according to this embodiment, the data transmission unit 101 can be commonized for plural types of semiconductor chips. The data transmission unit 101 can be designed in advance as a common circuit, and it is only necessary to (1) design reception shift registers and (2) design connections of the reception shift registers and the data transmission unit 101 for each type of semiconductor chip. Accordingly, the number of designing steps of a semiconductor chip can be reduced.

Second Embodiment

Figure 5:
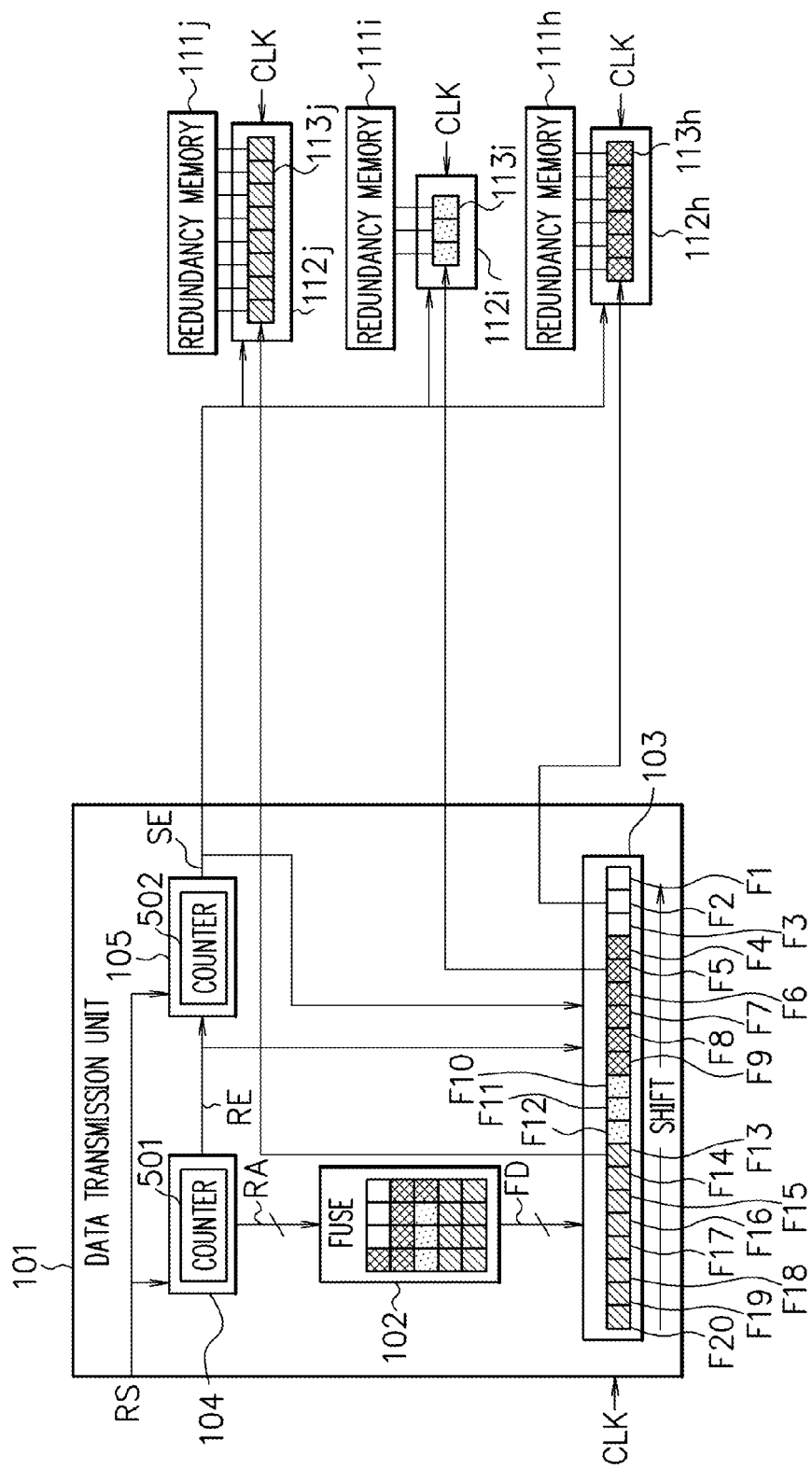
FIG. 5 is a diagram illustrating a structural example of a semiconductor chip of a data transfer circuit according to a second embodiment.

FIG. 5 is a diagram illustrating a structural example of a semiconductor chip of a data transfer circuit according to a second embodiment, and illustrates an example of implementing the data transfer circuit of FIG. 1. Differences of this embodiment (FIG. 5) from the first embodiment (FIGS. 1A and 1B) will be described below.

A reception shift register 112h has six flip flop circuits 113h for example, and can shift data of the six flip flop circuits 113h in the direction from left to right in synchronization with a clock signal CLK. To a redundancy memory 111h, 6-bit data can be inputted from the six flip flop circuits 113h in the reception shift register 112h.

A reception shift register 112i has three flip flop circuits 113i for example, and can shift data of the three flip flop circuits 113i in the direction from left to right in synchronization with the clock signal CLK. To a redundancy memory 111i, 3-bit data can be inputted from the three flip flop circuits 113i in the reception shift register 112i.

A reception shift register 112j has eight flip flop circuits 113j for example, and can shift data of the eight flip flop circuits 113j in the direction from left to right in synchronization with the clock signal CLK. To a redundancy memory 111j, 8-bit data can be inputted from the eight flip flop circuits 113j in the reception shift register 112j.

A transmission shift register 103 has 20 flip flop circuits F1 to F20 which store data, and can shift data of the 20 flip flop circuits F1 to F20 in a direction from the flip flop circuit F20 to F1. The number of flip flop circuits F1 to F20 in the transmission shift register 103 is the same as the bit number of all data stored in a non-volatile memory 102.

An input terminal of the first flip flop circuit in the reception shift register 112h is connected to an output terminal of the flip flop circuit F2 in the transmission shift register 103. An input terminal of the first flip flop circuit in the reception shift register 112i is connected to an output terminal of the flip flop circuit F5 in the transmission shift register 103. An input terminal of the first flip flop circuit in the reception shift register 112j is connected to an output terminal of the flip flop circuit F13 in the transmission shift register 103.

Next, operation of the data transfer circuit will be described. In the non-volatile memory 102, information of addresses of defective ordinary memory cells of the redundancy memories 111h to 111j is written in order from the head without any space. Next, an activated reset signal RS is inputted to a read control unit 104 and a transfer control unit 105. Once the reset signal RS is activated, a read counter 501 in the read control unit 104 resets a read address RA counted by the read counter 501 to "0", and outputs the read address RA of "0" to the non-volatile memory 102. Once the reset signal RS is activated, the transfer control unit 105 resets the count value counted by a shift counter 502 to 0, and outputs a disabled shift enable signal SE to the transmission shift register 103 and the reception shift registers 112h to 112j.

Next, the reset signal RS is deactivated. Once the reset signal RS is deactivated, the read counter 501 in the read control unit 104 counts up the read address RA in synchronization with the clock signal CLK, outputs the read address RA to the non-volatile memory 102, and outputs an enabled read enable signal RE to the transfer control unit 105 and the transmission shift register 103. The read control unit 104 sequentially reads data stored at the address RA of the non-volatile memory 102 and sequentially writes the data in the flip flop circuits F1 to F20 in the transmission shift register 103.

For example, the non-volatile memory 102 outputs 4-bit data FD to the transmission shift register 103 in parallel. When the read address RA is "0", the 4-bit data stored at the address RA of "0" of the non-volatile memory 102 are written in the flip flop circuits F1 to F4. Next, when the read address RA is "1", the 4-bit data stored at the address RA of "1" of the non-volatile memory 102 are written in the flip flop circuits F5 to F8. Next, when the read address RA is "2", the 4-bit data stored at the address RA of "2" of the non-volatile memory 102 are written in the flip flop circuits F9 to F12. Next, when the read address RA is "3", the 4-bit data stored at the address RA of "3" of the non-volatile memory 102 are written in the flip flop circuits F13 to F16. Next, when the read address RA is "4", the 4-bit data stored at the address RA of "4" of the non-volatile memory 102 are written in the flip flop circuits F17 to F20.

When the read address RA counted by the read counter 501 is different from an end address MAX1 (for example, "5"), the read control unit 104 enables the read enable signal RE, and performs writing in the transmission shift register 103. Further, when the read address RA counted by the read counter 501 is the same as the end address MAX1 (for example, "5"), the read control unit 104 ends the counting up of the read address RA and disables the read enable signal RE. When the read enable signal RE is disabled, writing to the transmission shift register 103 is finished.

In the flip flop circuits F4 to F9, address information of defective ordinary memory cells of the redundancy memory 111h is stored. In the flip flop circuits F10 to F12, address information of defective ordinary memory cells of the redundancy memory 111i is stored. In the flip flop circuits F13 to F20, address information of defective ordinary memory cells of the redundancy memory 111j is stored.

When the read enable signal RE is disabled and the count value counted by the shift counter 502 is different from a data shift amount MAX2 (for example, "8"), the shift counter 502 counts up the count value in synchronization with the clock signal CLK, and the transfer control unit 105 enables the shift enable signal SE. In other cases, the shift counter 502 maintains the count value, and the transfer control unit 105 disables the shift enable signal SE.

When the above-described writing to the transmission shift register 103 is finished, the read enable signal RE is disabled, the shift counter 502 starts counting up the count value, and the shift enable signal SE is enabled. When the shift enable signal SE is enabled, the transmission shift register 103 and the reception shift registers 112h to 112j shift data in synchronization with the clock signal CLK. When the count value counted by the shift counter 502 becomes the same as the data shift amount MAX2 (for example, "8"), the shift enable signal SE is disabled, the transmission shift register 103 and the reception shift registers 112h to 112j finish the data shift and retain the data. Thus, the transmission shift register 103 and the reception shift registers 112h to 112j consequently perform eight shift operations. The transmission shift register 103 and the reception shift registers 112h to 112j have a data shift amount of "8" which is the same as each other.

In the six flip flop circuits 113h in the reception shift register 112h after the shift, the data stored in the flip flop circuits F4 to F9 in the transmission shift register 103 before the shift, that is, the address information of defective ordinary memory cells of the redundancy memory 111h is stored.

In the three flip flop circuits 113i in the reception shift register 112i after the shift, the data stored in the flip flop circuits F10 to F12 in the transmission shift register 103 before the shift, that is, the address information of defective ordinary memory cells of the redundancy memory 111i is stored.

In the eight flip flop circuits 113j in the reception shift register 112j after the shift, the data stored in the flip flop circuits F13 to F20 in the transmission shift register 103 before the shift, that is, the address information of defective ordinary memory cells of the redundancy memory 111j is stored.

Note that the number of flip flop circuits 113h to 113j in the reception shift registers 112h to 112j is less than or equal to the maximum countable value of the shift counter 502.

Third Embodiment

Figure 6:
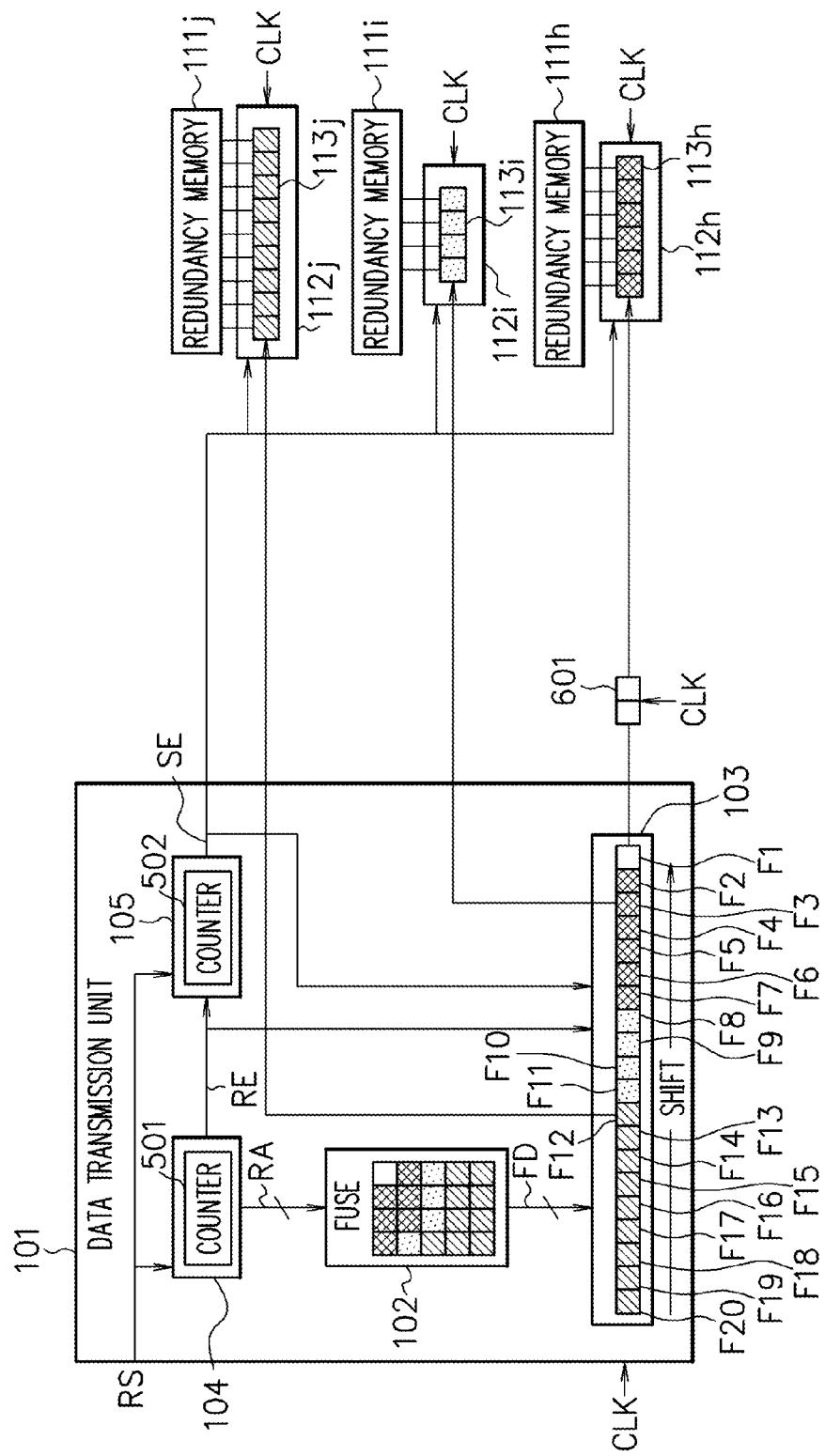
FIG. 6 is a diagram illustrating a structural example of a semiconductor chip of a data transfer circuit according to a third embodiment.

FIG. 6 is a diagram illustrating a structural example of a semiconductor chip of a data transfer circuit according to a third embodiment. This embodiment (FIG. 6) is such that an auxiliary shift register 601 is added to the second embodiment (FIG. 5). Differences of this embodiment from the second embodiment will be described below.

The auxiliary shift register 601 is a third shift register, has two flip flop circuits for example, and can shift data of the two flip flop circuits in the direction from left to right. The auxiliary shift register 601 is connected between an output terminal of the flip flop circuit F1 in the transmission shift register 103 and the input terminal of the reception shift register 112h, shifts data inputted from the output terminal of the flip flop circuit F1, and outputs the data to the reception shift register 112h. By providing the auxiliary shift register 601, the same effect as increasing the number of flip flop circuits in the transmission shift register 103 can be obtained.

The reception shift register 112h has six flip flop circuits 113h, and outputs 6-bit data to the redundancy memory 111h. The reception shift register 112i has four flip flop circuits 113i and outputs 4-bit data to the redundancy memory 111i. The reception shift register 112j has nine flip flop circuits 113j and outputs 9-bit data to the redundancy memory 111j.

An input terminal of the reception shift register 112h is connected to the output terminal of the flip flop circuit F1 in the transmission shift register 103 via the auxiliary shift register 601. The input terminal of the reception shift register 112i is connected to an output terminal of the flip flop circuit F3 in the transmission shift register 103. The input terminal of the reception shift register 112j is connected to an output terminal of the flip flop circuit F12 in the transmission shift register 103.

The read control unit 104 reads data of the non-volatile memory 102 and writes the data in the flip flop circuits F1 to F20 in the transmission shift register 103. In the flip flop circuits F2 to F7, address information of defective ordinary memory cells of the redundancy memory 111$h$ is stored. In the flip flop circuits F8 to F11, address information of defective ordinary memory cells of the redundancy memory 111$i$ is stored. In the flip flop circuits F12 to F20, address information of defective ordinary memory cells of the redundancy memory 111$j$ is stored.

The transfer control unit 105 instructs by a shift enable signal SE the transmission shift register 103 and the reception shift registers 112$h$ to 112$j$ to perform a data shift with a shift amount "9". Note that the transfer control unit 105 may output the shift enable signal SE to the auxiliary shift register 601. Thus, the transmission shift register 103, the auxiliary shift register 601, and the reception shift registers 112$h$ to 112$j$ perform the data shift with a shift amount "9" in synchronization with the clock signal CLK.

In the six flip flop circuits 113$h$ in the reception shift register 112$h$ after the shift, the data stored in the flip flop circuits F2 to F7 in the transmission shift register 103 before the shift, that is, the address information of defective ordinary memory cells of the redundancy memory 111$h$ is stored.

In the four flip flop circuits 113$i$ in the reception shift register 112$i$ after the shift, the data stored in the flip flop circuits F8 to F11 in the transmission shift register 103 before the shift, that is, the address information of defective ordinary memory cells of the redundancy memory 111$i$ is stored.

In the nine flip flop circuits 113$j$ in the reception shift register 112$j$ after the shift, the data stored in the flip flop circuits F12 to F20 in the transmission shift register 103 before the shift, that is, the address information of defective ordinary memory cells of the redundancy memory 111$j$ is stored.

Note that the auxiliary shift register 601 is not limited to the connection to the reception shift register 112$h$ and may be connected between the input terminals of the reception shift register 112$i$ and/or 112$j$ and one of the output terminals of the flip flop circuits F1 to F20.

Fourth Embodiment

Figure 7:
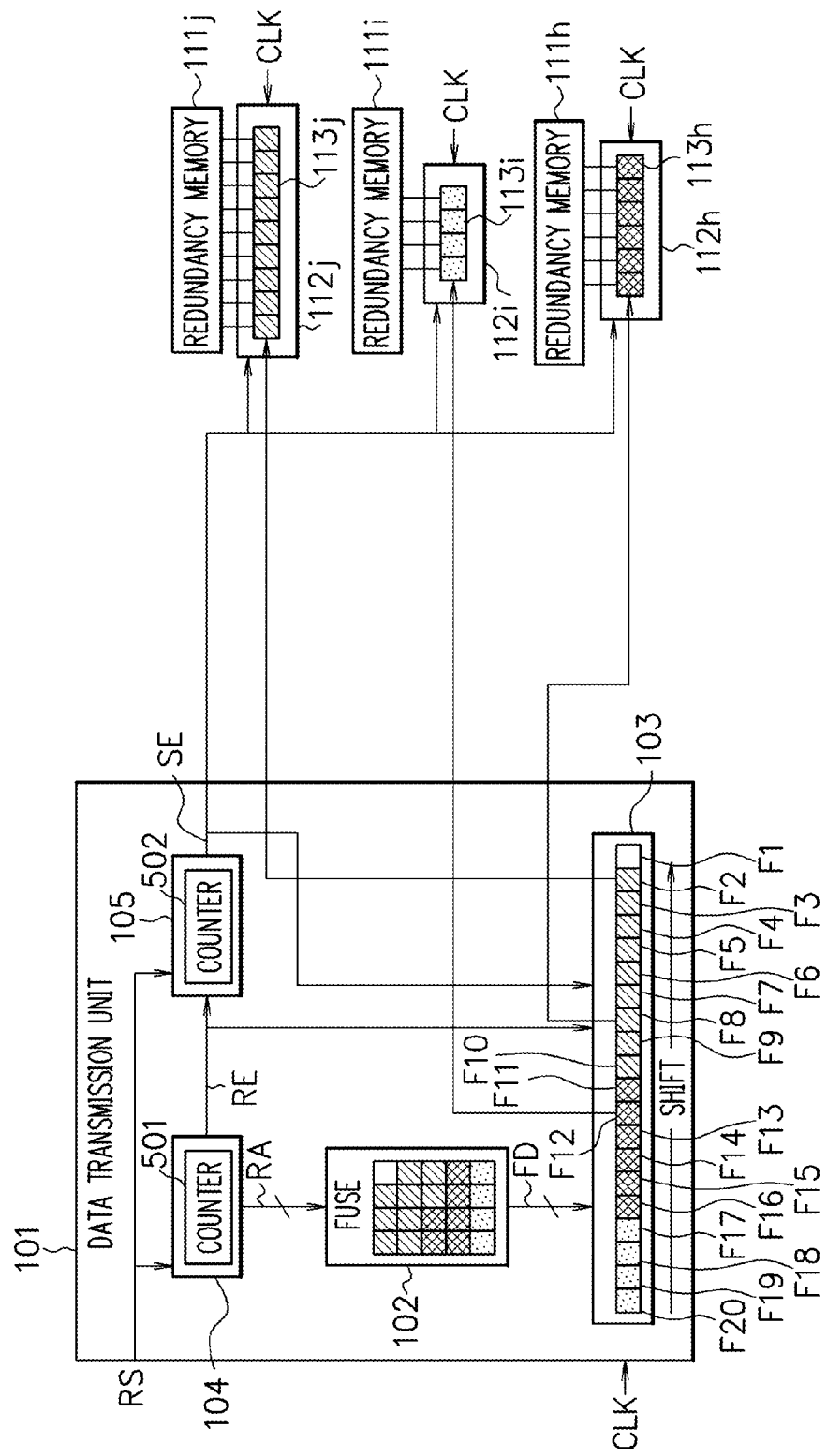
FIG. 7 is a diagram illustrating a structural example of a semiconductor chip of a data transfer circuit according to a fourth embodiment.

FIG. 7 is a diagram illustrating a structural example of a semiconductor chip of a data transfer circuit according to a fourth embodiment. This embodiment (FIG. 7) is such that, with respect to the third embodiment (FIG. 6), the auxiliary shift register 601 is deleted and connection destinations of the input terminals of the reception shift registers 112$h$ to 112$j$ are different. Differences of this embodiment from the third embodiment will be described below.

An input terminal of the reception shift register 112$h$ is connected to the output terminal of the flip flop circuit F8 in the transmission shift register 103. The input terminal of the reception shift register 112$i$ is connected to the output terminal of the flip flop circuit F12 in the transmission shift register 103. The input terminal of the reception shift register 112$j$ is connected to the output terminal of the flip flop circuit F2 in the transmission shift register 103.

The input terminals of the reception shift registers 112$h$ to 112$j$ are, in order from one having a larger number of flip flop circuits 113$h$ to 113$j$ inside the reception shift registers 112$h$ to 112$j$, connected to the output terminals of the flip flop circuits F1 to F20 in order from one closer to the head of the transmission shift register 103.

The reception shift register 112$j$ has the largest number of flip flop circuits 113$j$ and hence is connected to the output terminal of the flip flop circuit F2. The reception shift register 112$h$ has the second largest number of flip flop circuits 113$h$ and hence is connected to the output terminal of the flip flop circuit F8. The reception shift register 112$i$ has the third largest number of flip flop circuits 113$i$ and hence is connected to the output terminal of the flip flop circuit F12. The reception shift registers 112$h$ to 112$j$ are connected to the output terminals of the flip flop circuits F1 to F20 such that the larger the number of flip flop circuits 113$h$ to 113$j$ inside the reception shift registers 112$h$ to 112$j$ is, the closer the flip flop circuits F1 to F20 are to the head of the transmission shift register 103.

The read control unit 104 reads data of the non-volatile memory 102 and writes the data in the flip flop circuits F1 to F20 in the transmission shift register 103. In the flip flop circuits F2 to F10, address information of defective ordinary memory cells of the redundancy memory 111$j$ is stored. In the flip flop circuits F11 to F16, address information of defective ordinary memory cells of the redundancy memory 111$h$ is stored. In the flip flop circuits F17 to F20, address information of defective ordinary memory cells of the redundancy memory 111$i$ is stored.

The transfer control unit 105 instructs by a shift enable signal SE the transmission shift register 103 and the reception shift registers 112$h$ to 112$j$ to perform a data shift with a shift amount "9". Thus, the transmission shift register 103 and the reception shift registers 112$h$ to 112$j$ perform the data shift with a shift amount "9" in synchronization with the clock signal CLK.

In the nine flip flop circuits 113$j$ in the reception shift register 112$j$ after the shift, the data stored in the flip flop circuits F2 to F10 in the transmission shift register 103 before the shift, that is, the address information of defective ordinary memory cells of the redundancy memory 111$j$ is stored.

In the six flip flop circuits 113$h$ in the reception shift register 112$h$ after the shift, the data stored in the flip flop circuits F11 to F16 in the transmission shift register 103 before the shift, that is, the address information of defective ordinary memory cells of the redundancy memory 111$h$ is stored.

In the four flip flop circuits 113$i$ in the reception shift register 112$i$ after the shift, the data stored in the flip flop circuits F17 to F20 in the transmission shift register 103 before the shift, that is, the address information of defective ordinary memory cells of the redundancy memory 111$i$ is stored.

According to this embodiment, by deciding connection destinations of the input terminals of the reception shift registers 112$h$ to 112$j$ in ascending order of the number of flip flop circuits 113$h$ to 113$j$ in the reception shift register 112$h$ to 112$j$, the auxiliary shift register 601 (FIG. 6) becomes unnecessary.

Fifth Embodiment

Figure 8:
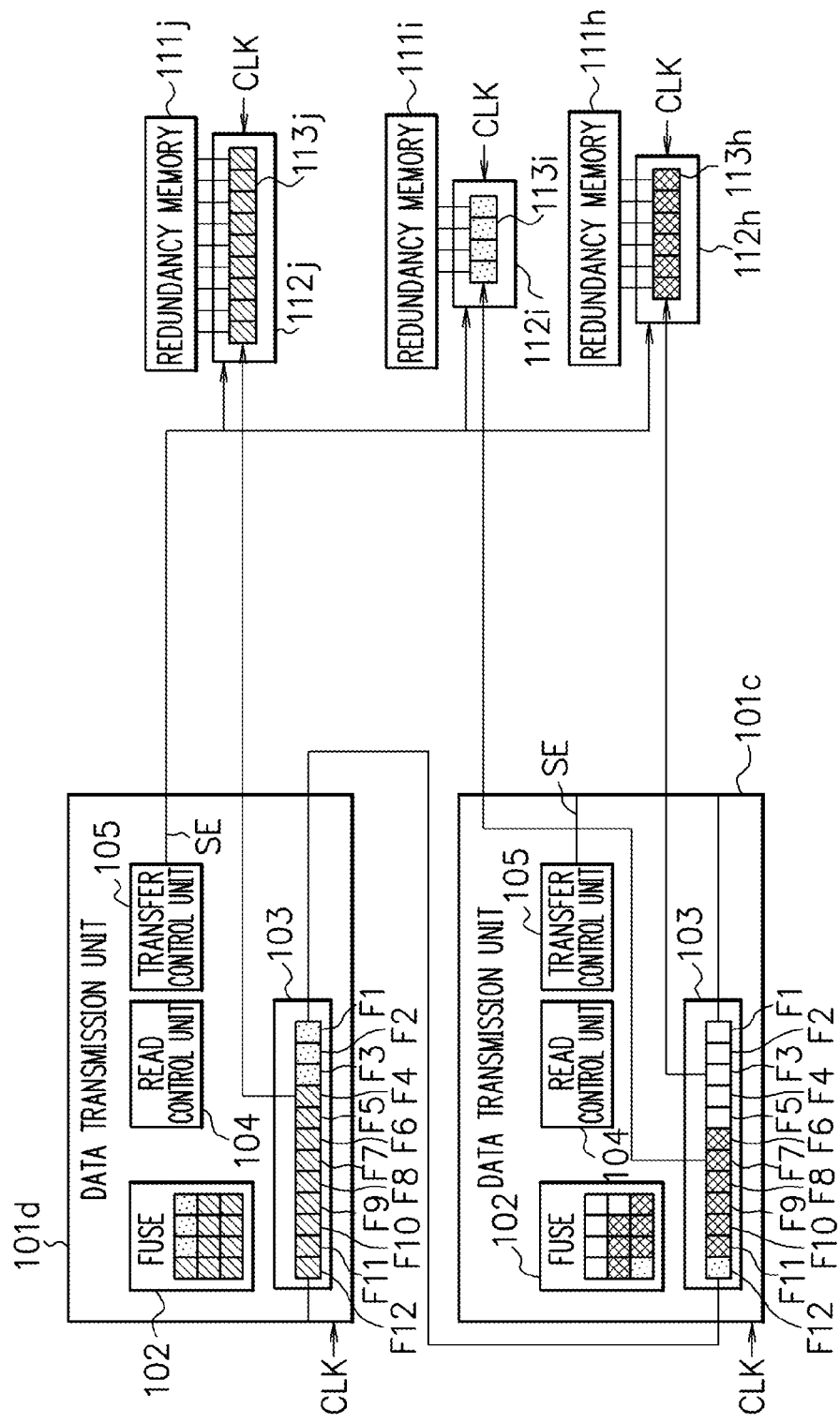
FIG. 8 is a diagram illustrating a structural example of a semiconductor chip of a data transfer circuit according to a fifth embodiment.

FIG. 8 is a diagram illustrating a structural example of a semiconductor chip of a data transfer circuit according to a fifth embodiment. This embodiment (FIG. 8) is different from the second embodiment (FIG. 5) in that two data transmission units 101$c$ and 101$d$ are used. Differences of this embodiment from the second embodiment will be described below.

The data transmission units 101$c$ and 101$d$ each have a non-volatile memory 102, a transmission shift register 103, a read control unit 104, and a transfer control unit 105 similarly to the data transmission unit 101 of FIG. 5, and have the same structure as each other. The transmission shift register 103 has twelve shift registers F1 to F12. An input terminal and an output terminal of the transmission shift register 103 are connectable to an outside of the data transmission unit 101c or 101d. An input terminal of the flip flop circuit F12 at the end in the transmission shift register 103 of the first data transmission unit 101c is connected to an output terminal of the flip flop circuit F1 at the head in the transmission shift register 103 of the second data transmission unit 101d. That is, the data transmission units 101c and 101d are connected in series. Thus, the transmission shift register 103 in the data transmission unit 101c and the transmission shift register 103 in the data transmission unit 101d are assumed as one shift register and is connected to the reception shift registers 112h to 112j.

The first data transmission unit 101c has a transmission shift register (first shift register) 103 and first flip flop circuits F1 to F12. The second data transmission unit 101d has a transmission shift register (fourth shift register) 103 and fourth flip flop circuits F1 to F12. To the transmission shift register 103 of the data transmission unit 101c, data shifted by the transmission shift register 103 of the data transmission unit 101d are inputted, and the data inputted from the transmission shift register 103 of the data transmission unit 101d can be shifted therein.

The reception shift register 112h has six flip flop circuits 113h, and outputs 6-bit data to the redundancy memory 111h. The reception shift register 112i has four flip flop circuits 113i and outputs 4-bit data to the redundancy memory 111i. The reception shift register 112j has nine flip flop circuits 113j and outputs 9-bit data to the redundancy memory 111j.

An input terminal of the reception shift register 112h is connected to an output terminal of the flip flop circuit F3 in the transmission shift register 103 of the data transmission unit 101c. An input terminal of the reception shift register 112i is connected to an output terminal of the flip flop circuit F7 in the transmission shift register 103 of the data transmission unit 101c. An input terminal of the reception shift register 112j is connected to an output terminal of the flip flop circuit F4 in the transmission shift register 103 of the data transmission unit 101d.

In the data transmission unit 101c, the read control unit 104 reads data of the non-volatile memory 102 and writes the data in the flip flop circuits F1 to F12 in the transmission shift register 103. In the data transmission unit 101d, the read control unit 104 reads data of the non-volatile memory 102 and writes the data in the flip flop circuits F1 to F12 in the transmission shift register 103.

In the flip flop circuits F6 to F11 in the data transmission unit 101c, address information of defective ordinary memory cells of the redundancy memory 111h is stored. In the flip flop circuit F12 in the data transmission unit 101c and the flip flop circuits F1 to F3 in the data transmission unit 101d, address information of defective ordinary memory cells of the redundancy memory 111i is stored. In the flip flop circuits F4 to F12 in the data transmission unit 101d, address information of defective ordinary memory cells of the redundancy memory 111j is stored.

The transfer control unit 105 in the data transmission unit 101d instructs by a shift enable signal SE the transmission shift register 103 in the data transmission unit 101d and the reception shift registers 112h to 112j to perform a data shift with a shift amount "9". The transfer control unit 105 in the data transmission unit 101c instructs by the shift enable signal SE the transmission shift register 103 in the data transmission unit 101c to perform a data shift with a shift amount "9". Note that to the reception shift registers 112h to 112j, the shift enable signal SE may be inputted from the transfer control unit 105 in the data transmission unit 101c instead of the transfer control unit 105 in the data transmission unit 101d. Thus, the transmission shift register 103 in the data transmission unit 101c, the transmission shift register 103 in the data transmission unit 101d, and the reception shift registers 112h to 112j perform the data shift with a shift amount "9" in synchronization with the clock signal CLK.

In the six flip flop circuits 113h in the reception shift register 112h after the shift, the data stored in the flip flop circuits F6 to F11 in the data transmission unit 101c before the shift, that is, the address information of defective ordinary memory cells of the redundancy memory 111h is stored.

In the four flip flop circuits 113i in the reception shift register 112i after the shift, the data stored in the flip flop circuit F12 in the data transmission unit 101c and the flip flop circuits F1 to F3 in the data transmission unit 101d before the shift, that is, the address information of defective ordinary memory cells of the redundancy memory 111i is stored.

In the nine flip flop circuits 113j in the reception shift register 112j after the shift, the data stored in the flip flop circuits F4 to F12 in the data transmission unit 101d before the shift, that is, the address information of defective ordinary memory cells of the redundancy memory 111j is stored.

This embodiment is effective when the address information of defective ordinary memory cells of the three redundancy memories 111h to 111j is larger than the capacity of the non-volatile memory 102 in one data transmission unit 101c. By using the plurality of data transmission units 101c and 101d, the address information of defective ordinary memory cells of the three redundancy memories 111h to 111j can be stored in a divided manner in the non-volatile memory 102 in the data transmission unit 101c and the non-volatile memory 102 in the data transmission unit 101d. By connecting the transmission shift register 103 in the data transmission unit 101c and the transmission shift register 103 in the data transmission unit 101d in series, the two transmission shift registers 103 can be assumed as one transmission shift register and connected to the three reception shift registers 112h to 112j. By simultaneously resetting all the data transmission units 101c and 101d by the reset signal RS, shift operations can be started simultaneously.

Note that to the output terminals of the flip flop circuits F1 to F12 in the data transmission unit 101d, a plurality of reception shift registers can be connected. The transmission shift register 103 in the data transmission unit 101d shifts data of the flip flop circuits F1 to F12 inside, and transmits data of the output terminal of one or more flip flop circuits F4 among the output terminals of the flip flop circuits F1 to F12 inside to one or more reception shift registers 112j. In the transmission shift register 103 in the data transmission unit 101c, data shifted by the transmission shift register 103 in the data transmission unit 101d are inputted, and data inputted from the transmission shift register 103 in the data transmission unit 101d are shifted and transmitted to the reception shift registers 112h and 112i.

Sixth Embodiment

Figure 9:
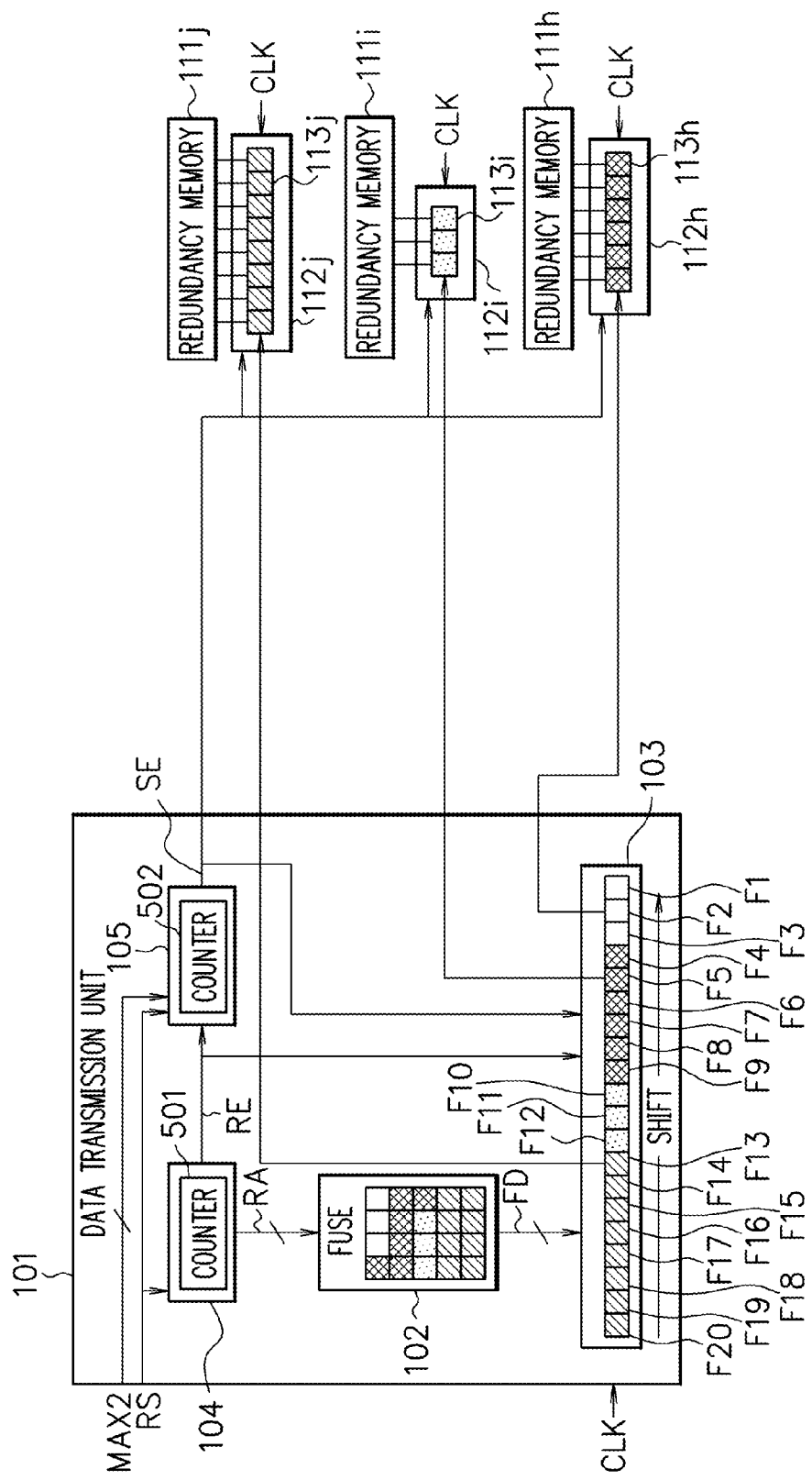
FIG. 9 is a diagram illustrating a structural example of a semiconductor chip of a data transfer circuit according to a sixth embodiment.

FIG. 9 is a diagram illustrating a structural example of a semiconductor chip of a data transfer circuit according to a sixth embodiment. This embodiment (FIG. 9) is different from the second embodiment (FIG. 5) in that the data shift amount MAX2 is changeable. Differences of this embodiment from the second embodiment will be described below.

To the transfer control unit 105, the data shift amount MAX2 is inputted from the outside of the data transmission unit 101. The data shift amount MAX2 is a number less than or equal to the maximum countable value of the shift counter 502. Similarly to the second embodiment, the transfer control unit 105 compares the count value counted by the shift counter 502 with the data shift amount MAX2, and controls the shift enable signal SE. Thus, the data shift amount MAX2 of the transmission shift register 103 and the reception shift registers 112h to 112j can be made changeable, enabling to respond to various reception shift registers 112h to 112j.

Note that the example in which the data transfer circuit transfers the address information of defective ordinary memory cells of the redundancy memories 111a to 111j is explained in the first to sixth embodiments, but the embodiments are not limited to this. For example, the data transfer circuit can transfer information of identifiers of the devices 111a to 111j, transfer security codes of the devices 111a to 111j, or transfer characteristic adjustment information (trimming information) of the devices 111a to 111j.

According to the number of second shift registers and/or the number of flip flop circuits inside each of two or more second shift registers, data are transmitted to the second shift registers from different output terminals of the flip flop circuits. Thus, a first data transmission unit can be commonized for plural types of semiconductor chips.

It should be noted that all the above embodiments merely illustrate specific examples for carrying out the present invention, and the technical scope of the invention should not be construed as limited by these embodiments. That is, the invention may be embodied in other various forms without departing from the technical ideas or principal features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data transfer circuit, comprising:
   a first data transmission unit; and
   two or more second shift registers, wherein
   the first data transmission unit has a first shift register which has a plurality of first flip flop circuits which store data, shifts the data of the plurality of first flip flop circuits, and transmits data of two or more output terminals out of output terminals of the plurality of first flip flop circuits to the two or more second shift registers, and
   the two or more second shift registers each shift data inputted from the two or more output terminals out of the output terminals of the plurality of first flip flop circuits.

2. The data transfer circuit according to claim 1, wherein according to the number of second shift registers or the number of flip flop circuits inside each of the two or more second shift registers or a combination thereof, data are transmitted to the second shift registers from different output terminals of the first flip flop circuits.

3. The data transfer circuit according to claim 1, wherein the first data transmission unit has:
   a non-volatile memory which stores data; and
   a read control unit which reads data of the non-volatile memory into the first shift register.

4. The data transfer circuit according to claim 1, wherein the first data transmission unit has a transfer control unit which outputs a shift enable signal to the first shift register and the two or more second shift registers, and
   the first shift register and the two or more second shift registers shift data when the shift enable signal indicates to enable.

5. The data transfer circuit according to claim 1, wherein the first shift register and the two or more second shift registers are same as each other in shift amount of data.

6. The data transfer circuit according to claim 1, further comprising
   a third shift register connected between input terminals of the second shift registers and the output terminals of the first flip flop circuits.

7. The data transfer circuit according to claim 1, wherein the two or more second shift registers are connected to the output terminals of the first flip flop circuits such that the larger the number of flip flop circuits inside the two or more second shift registers is, the closer the first flip flop circuits are to a head of the first shift register.

8. The data transfer circuit according to claim 1, further comprising
   a second data transmission unit, wherein
   the second data transmission unit has a fourth shift register which has a plurality of fourth flip flop circuits which store data, shifts the data of the plurality of fourth flip flop circuits, and transmits data of one or more output terminals out of output terminals of the plurality of fourth flip flop circuits to the one or more second shift registers, and
   in the first shift register, data shifted by the fourth shift registers are inputted, and the data inputted from the fourth shift register are shifted.

9. The data transfer circuit according to claim 1, wherein a shift amount of the data is changeable.

* * * * *